(12) United States Patent
Sakai et al.

(10) Patent No.: US 7,329,480 B2
(45) Date of Patent: Feb. 12, 2008

(54) RADIATION-SENSITIVE NEGATIVE-TYPE RESIST COMPOSITION FOR PATTERN FORMATION METHOD

(75) Inventors: Nobuji Sakai, Inba-gun (JP); Kentaro Tada, Inba-gun (JP)

(73) Assignee: Toyo Gosei Co., Ltd., Ichikawa-shi, Chiba (JP)

( * ) Notice: Subject to any disclaimer, the term of this patent is extended or adjusted under 35 U.S.C. 154(b) by 128 days.

(21) Appl. No.: 10/526,383

(22) PCT Filed: Aug. 29, 2003

(86) PCT No.: PCT/JP03/11029

§ 371 (c)(1), (2), (4) Date: Sep. 13, 2005

(87) PCT Pub. No.: WO2004/023213

PCT Pub. Date: Mar. 18, 2004

(65) Prior Publication Data

US 2006/0172222 A1 Aug. 3, 2006

(30) Foreign Application Priority Data

Aug. 30, 2002 (JP) ............................. 2002-252926

(51) Int. Cl.
G03F 7/038 (2006.01)
G03F 7/004 (2006.01)

(52) U.S. Cl. .................... 430/315; 430/280.1; 430/324

(58) Field of Classification Search .................... None
See application file for complete search history.

(56) References Cited

U.S. PATENT DOCUMENTS

| | | | |
|---|---|---|---|
| 4,231,951 A | 11/1980 | Smith et al. | |
| 4,256,828 A | 3/1981 | Smith | |
| 4,565,859 A | 1/1986 | Murai et al. | |
| 5,478,606 A | 12/1995 | Ohkuma et al. | |
| 6,106,998 A | 8/2000 | Maeda et al. | |
| 2006/0189160 A1* | 8/2006 | Hattori et al. | 438/780 |

FOREIGN PATENT DOCUMENTS

| | | | |
|---|---|---|---|
| JP | 60-166675 A | | 8/1985 |
| JP | 60-247515 A | | 12/1985 |
| JP | 61-283614 A | | 12/1986 |
| JP | 63-251416 A | * | 10/1988 |
| JP | 2519480 B2 | | 4/1989 |
| JP | 5-24119 A | | 2/1993 |
| JP | 5-222112 A | | 8/1993 |
| JP | 6-157624 A | | 6/1994 |
| JP | 6-184170 A | | 7/1994 |
| JP | 7-61964 A | | 3/1995 |
| JP | 7-78628 A | | 3/1995 |
| JP | 8-165290 A | | 6/1996 |
| JP | 2000-239309 A | | 9/2000 |

OTHER PUBLICATIONS

Yokoshima et al (AN 1989:214189 from CAPLUS (Copyright 2007 acs ON stn, Two Pages, entered into STN on Jun. 10, 1989 as English Abstraqct of JP 63-251416-A.*
Nlppon Kayaku KK (Derwent-AC No: 1988-335884) from Derwent Information LTD, two pages abstracted from JP 63251416 A.*

* cited by examiner

*Primary Examiner*—Cynthia Hamilton
(74) *Attorney, Agent, or Firm*—Brian A. Gomez; Gomez International Patent Office, LLC (57) ABSTRACT

The radiation-sensitive negative-type resist composition for pattern formation containing an epoxy resin, a radiation-sensitive cationic polymerization initiator, and a solvent for dissolving the epoxy resin therein, characterized in that the resist composition, through drying, forms a resist film having a softening point falling within range of 30 to 120 C and that the epoxy resin is represented by formula (1): (wherein R1 represents a moiety derived from an organic compound having k active hydrogen atoms (k represents an integer of 1 to 100); each of $n_1$, $n_2$, through $n_k$ represents 0 or an integer of 1 to 100; the sum of $n_1$, $n_2$, through $n_K$ falls within a range of 1 to 100; and each of "A"s, which may be identical to or different from each other, represents an oxycyclohexane skeleton represented by formula (2): (wherein X represents any of groups represented by formulas (3) to (5): and at least two groups represented by formula (3) are contained in one molecule of the epoxy resin))

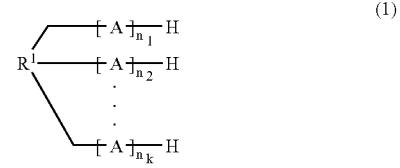

(1)

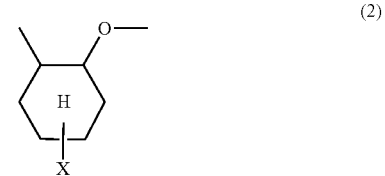

(2)

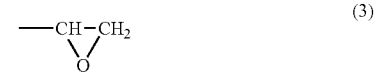

(3)

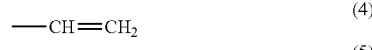

(4)

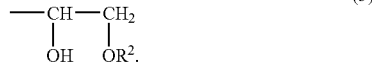

(5)

4 Claims, 2 Drawing Sheets

RADIATION-SENSITIVE NEGATIVE-TYPE RESIST COMPOSITION FOR PATTERN FORMATION METHOD

TECHNICAL FIELD

The present invention relates to a radiation-sensitive negative-type resist composition for pattern formation and, more particularly, to a radiation-sensitive negative-type resist composition capable of readily forming a pattern having a high aspect ratio (hereinafter referred to as a high-aspect pattern) with high precision. The invention also relates to a method for forming a pattern by use of the resist composition.

BACKGROUND ART

Mechanical processing such as cutting has been suitably employed for forming patterns of precision parts such as electronic parts, optical parts, and biochips. However, mechanical processing cannot keep pace with a recent trend towards high-resolution micropatterning and fails to attain a required precision. Thus, demand has arisen for a microprocessing technique that would replace mechanical processing. Meanwhile, in the field of semiconductor microprocessing, a microprocessing technique making use of a photoresist is employed as a high-precision processing method, and in recent years the technique has attained a very high precision on a sub-micron level. In another known high-aspect processing method, PMMA (polymethyl methacrylate) serves as a photoresist under irradiation with X-rays.

Although photoresists employed for microprocessing of a semiconductor are suitable for thin film processing, these resists are not suited for processing a thick film having a thickness of 50 μm or more, particularly 100 μm or more, required for producing a variety of parts. In addition, since these resists exhibit poor mechanical strength and poor weather resistance, resist patterns obtained from the resists cannot be used as permanent patterns. If a resist pattern could be used as a permanent pattern, the resist pattern itself can serve as a precision part without further processing. As a result, the number of steps required for producing precision parts would be greatly reduced, thereby providing industrial utility.

In contrast to PMMA, epoxy resins are suited for forming permanent patterns. Namely, epoxy resins have excellent mechanical strength, adhesion to a substrate, and weather resistance, and are employed as coating materials and materials for producing parts. One proposed method for processing epoxy resin is "photo-fabrication of three-dimensional objects" (see Japanese Patent Application Laid-Open (kokai) Nos. 60-247515 and 5-24119). Materials which are applicable to such a method are disclosed in, for example, Japanese Patent Application Laid-Open (kokai) No. 2000-239309.

The photo-fabrication of three-dimensional objects includes repeated steps for selectively irradiating liquid photocurable resin with a laser beam or a similar beam so as to form a cured resin layer, to thereby form three-dimensional objects. However, the method, which is a type of direct writing method, is not suited for large-scale production.

Another known method for processing epoxy resin is a production method for printed circuit boards disclosed in Japanese Patent Publication (kokoku) No. 7-78628. The photoresist used in the production is a commercial product, SU-8 (trade name), which is characterized in that the product can form a pattern of a thicker film as compared with other known photoresists.

However, SU-8 (trade name) has a notable drawback. Specifically, SU-8 contains a novolak epoxy resin and a radiation-sensitive cationic initiator as predominant ingredients, and the novolak epoxy resin is readily contaminated with Cl and Na during its production process. Because of such contamination, the formed resist pattern has poor electrical characteristics and therefore is not suited for a permanent pattern. SU-8 also has other problems, in that it exhibits intense absorption in a deep UV region (wavelength: $\leq 300$ nm) attributed to an aromatic ring included in the skeleton of novolak epoxy resin used in the material and that it has insufficient transparency in the UV region (wavelength: $\geq 300$ nm) and the visible light region. Therefore, production of optical parts and biochips from the photoresist is difficult, and limitations are imposed on the wavelength of exposure light, which is also problematic.

Studies conducted in recent years have confirmed that, in semiconductor microprocessing, shifting the wavelength of exposure light to a shorter wavelength in the UV region effectively enhances pattern precision. Therefore, another demerit of SU-8 is that it cannot be used in the deep UV region. Furthermore, a cationic initiator must be selected in accordance with light absorption (transparency) of the resin. Since most commercial cationic initiators have absorption bands similar in wavelength range to those of novolak epoxy resin, the initiator must be selected from a limited range of commercial cationic initiators.

Some commercially available monomer products for producing an aliphatic epoxy resin have no aromatic group and contain only trivial amounts of migrated Cl and Na. Examples include glycidyl (meth)acrylate, CYCLOMER A200, and CYCLOMER M100 ((meth)acrylate having an aliphatic epoxy group, products of Daicel Chemical Industries, Ltd.), and Celloxide 2000 (1-vinyl-3,4-epoxycyclohexane, product of Daicel Chemical Industries, Ltd.). These monomers are polymerized through radical polymerization or a similar method, to thereby synthesize epoxy resins.

However, (meth)acrylates such as glycidyl (meth)acrylate, CYCLOMER A200, and CYCLOMER M100 have a (meth)acrylate ester backbone and are known to have relatively high sensitivity to high-energy active beams such as electron beams, deep UV rays, and X-rays. When the (meth)acrylates are irradiated with any such active beams, a side reaction other than the target epoxy-group-polymerization occurs in the backbone, greatly varying and affecting physical properties (e.g., patterning characteristics, sensitivity to exposure, characteristics of cured products) of the produced resins. Thus, such a high sensitivity is not preferred. Celloxide 2000 has no (meth)acrylate backbone, but raises concerns over its toxicity. Therefore, it must be used under strict control.

The processing of PMMA through an X-ray for producing a high-aspect pattern has also drawbacks; i.e., use of an X-ray based on a particular light source, and a very long processing time stemming from the low photoresist sensitivity of PMMA.

DISCLOSURE OF THE INVENTION

In view of the foregoing, an object of the present invention is to provide a radiation-sensitive negative-type resist composition capable of forming, through a simple, high-productivity method employing any of a variety of light sources, a resist pattern which has high pattern precision, a great thickness, and a high aspect ratio and which can be applied to electronic parts, optical parts, biochips, etc. Another object of the invention is to provide a method for producing a pattern by use of the resist composition.

The present inventors have carried out extensive studies in order to solve the aforementioned problems, and have found that a specific aliphatic epoxy resin having no (meth) acrylic skeleton is suited for producing, through a simple, high-productivity method employing any of a variety of light sources, a resist pattern which has high pattern precision, a great thickness, and a high aspect ratio and which can be applied to electronic parts, optical parts, biochips, etc., particularly when the epoxy resin is used in combination with a predetermined initiator for forming a pattern. The present invention has been accomplished on the basis of this finding.

Accordingly, a first mode of the present invention is drawn to a radiation-sensitive negative-type resist composition for pattern formation containing an epoxy resin, a radiation-sensitive cationic polymerization initiator, and a solvent for dissolving the epoxy resin therein, characterized in that the resist composition, through drying, forms a resist film having a softening point falling within a range of 30 to 120° C. and that the epoxy resin is represented by formula (1):

(1)

(wherein $R^1$ represents a moiety derived from an organic compound having k active hydrogen atoms (k represents an integer of 1 to 100); each of $n_1$, $n_2$, through $n_k$ represents 0 or an integer of 1 to 100; the sum of $n_1$, $n_2$, through $n_k$ falls within a range of 1 to 100; and each of "A"s, which may be identical to or different from each other, represents an oxycyclohexane skeleton represented by formula (2):

(2)

(wherein X represents any of groups represented by formulas (3) to (5):

(3)

(4)

(5)

(wherein $R^2$ represents a hydrogen atom, an alkyl group, or an acyl group, herein, an alkyl group and an acyl group preferably have 1 to 20 carbon atoms, respectively), and at least two groups represented by formula (3) are contained in one molecule of the epoxy resin)).

A second mode of the present invention is directed to a radiation-sensitive negative-type resist composition for pattern formation mentioned in relation to the first mode, wherein the radiation-sensitive cationic polymerization initiator comprises one or more sulfonium salts.

A third mode of the present invention is directed to a radiation-sensitive negative-type resist composition for pattern formation mentioned in relation to the first or second modes, wherein the radiation-sensitive cationic polymerization initiator has one or more anion moieties, at least one species of the anion moieties being $SbF_6^-$.

A fourth mode of the present invention is directed to a radiation-sensitive negative-type resist composition for pattern formation mentioned in relation to any one of the first to third modes, wherein the radiation-sensitive cationic polymerization initiator has one or more anion moieties, at least one species of the anion moieties being a borate represented by formula (6):

(6)

(wherein each of $x_1$ to $x_4$ represents an integer of 0 to 5, and the sum $x_1+x_2+x_3+x_4$ is 1 or more).

A fifth mode of the present invention is directed to a radiation-sensitive negative-type resist composition for pattern formation mentioned in relation to any one of the first to fourth modes, wherein the epoxy resin has a softening point of 30° C. or higher.

A sixth mode of the present invention is directed to a method for forming a pattern, characterized in that the method comprises: a first step of applying to a substrate a radiation-sensitive negative-type resist composition for pattern formation as recited in relation to any of the first to fifth modes; a second step of drying the substrate coated with the radiation-sensitive negative-type resist composition for pattern formation, to thereby form a resist film; a third step of selectively exposing the formed resist film to an active energy beam according to a desired pattern; a fourth step of heating the exposed resist film so as to enhance a contrast of a pattern to be formed; and a fifth step of developing the heated resist film, to thereby remove the unexposed area of the resist film through dissolution, thereby forming a patterned layer.

A seventh mode of the present invention is directed to a method for forming a pattern mentioned in relation to the sixth modes, wherein the resist film has a thickness of at least 50 μm.

An eighth mode of the present invention is directed to a method for forming a pattern mentioned in relation to the sixth or seventh modes, wherein the method includes, after completion of the fifth step, a sixth step of applying to the patterned layer a material other than that of the patterned layer such that spaces present in the patterned layer are filled, at least to some height, with the material, to thereby form a second layer.

A ninth mode of the present invention is directed to a method for forming a pattern mentioned in relation to the eighth mode, wherein the second layer is formed through metal plating.

A tenth mode of the present invention is directed to a method for forming a pattern mentioned in relation to the eighth mode, wherein the second layer is formed by casting a photo-curable or heat-curable resin and curing the resin by light or heat.

BEST MODES FOR CARRYING OUT THE INVENTION

One characteristic feature of the present invention resides in that the resist composition contains a particular epoxy resin represented by formula (1) selected from among a number of conventionally employed curable resin compositions and, through drying, forms a resist film having a softening point falling within a range of 30 to 120° C. Through such selection, a resist pattern having a great thickness and a high aspect ratio can be obtained conveniently at high productivity in a simple manner by use of any of a variety of light sources. Meanwhile, Japanese Patent Application Laid-Open (kokai) No. 60-166675 discloses the above epoxy resin, and Japanese Patent Application Laid-Open (kokai) No. 61-283614 discloses a curable resin composition predominantly containing the epoxy resin and a photo-initiator. Notably, the latter document discloses that the curable resin composition has been developed only as a UV-curable resin composition, and provides no description in relation to pattern formation by use of the resin composition. Needless to say, the document provides no description indicating the specific radiation-sensitive negative-type resist composition for pattern formation or pattern formation by use of the resist composition. Therefore, those skilled in the art would not easily conceive the effect of the present invention; i.e., that a resist pattern having a great thickness and a high aspect ratio can be formed by use of the resist composition at high productivity in a simple manner by use of any of a variety of light sources.

The radiation-sensitive negative-type resist composition for pattern formation of the present invention contains an epoxy resin represented by formula (1), a radiation-sensitive cationic polymerization initiator, and a solvent for dissolving the epoxy resin therein. The radiation-sensitive negative-type resist composition for pattern formation can be applied to a substrate in a simple manner so as to accurately control film thickness (e.g., spin coating).

The radiation-sensitive negative-type resist composition for pattern formation, through drying, forms a resist film having a softening point falling within a range of 30 to 120° C., preferably a range of 35 to 100° C., more preferably a range of 40 to 80° C. The "softening point" is determined through measurement of the resist film formed through a predetermined drying step. The term "resist film formed through a predetermined drying step" refers to a resist film which is obtained by drying a radiation-sensitive negative-type resist composition for pattern formation applied to a substrate so as to control the amount of the solvent remaining in the resist film to 10 wt. % or less. When the resist film formed through drying is heated, the form of the film gradually changes from solid of high viscosity to fluid of low viscosity. The temperature at which a specific viscosity is obtained during the softening step is evaluated as the softening point of the resist film formed through drying. Specifically, the temperature is determined in accordance with the method of JIS K 7234. The thus-determined softening point of the resist film formed by drying the radiation-sensitive negative-type resist composition varies in accordance with mainly the type and content of the epoxy resin or the radiation-sensitive cationic polymerization initiator, as well as with the type, amount, and other parameters of the solvent remaining during drying or other additives. In other words, when these parameters are modified, the softening point can be controlled. As described above, in the present invention, the softening point of the resist film which is formed by drying a resist composition so as to control the amount of the solvent remaining in the resist film to 10 wt. % or less preferably falls within a range of 30 to 120° C. However, no particular limitation is imposed on conditions of the radiation-sensitive negative-type resist composition for pattern formation of the present invention upon use, so long as the resist composition has a softening point falling within the aforementioned range. Specifically, the amount of the solvent remaining in the film after the drying step may exceed 10 wt. % in the pattern formation step.

The negative-type resist composition of the present invention can be processed in the form of thick film having a thickness in excess of 50 μm. When such a thick film is processed, removal of a volatile component during the drying step causes reduction in volume of the film, thereby generating stress. In contrast with the case of a conventional thin resist film processing, the stress must be removed. The reason for removing the stress is that, when the resist film has a great thickness, the effect of the stress considerably increases, and defects such as creases, cracks, and foam tend to be generated in the resist film. In the present invention, since the negative-type resist composition exhibits a softening point of the resist film formed by drying the composition falling within the aforementioned temperature range, the stress generated in the film is relaxed by softening of the resist film during drying, to thereby prevent creases or other defects of the resist film. In addition, generation of folds at room temperature is prevented.

The polyether-type epoxy resin represented by formula (1) is produced by, for example, reacting 4-vinylcyclohex-ene-1-oxide with an organic compound having active hydrogen in the presence of a catalyst, to thereby yield a polyether compound and by partially or completely epoxidizing vinyl groups of the polyether compound by use of an oxidizing agent such as a peracid (e.g., peracetic acid) or a hydroperoxide. In this case, a small amount of acyl groups and similar groups may be introduced to the epoxy resin. Examples of organic compounds having active hydrogen include alcohols (e.g., linear or branched aliphatic alcohols, preferably polyhydric alcohols such as trimethylolpropane), phenols, carboxylic acids, amines, and thiols. Herein, organic compounds having active hydrogen preferably have a molecular weight of ten thousand or less. Notably, a moiety derived by removing active hydrogen from any of organic compounds having active hydrogen serves as $R^1$ in formula (1). Examples also includes commercially available products (e.g., EHPE-3150 (epoxy equivalent: 170 to 190, softening point: 70 to 90° C., product of Daicel Chemical Industries, Ltd.)). The epoxy resin represented by formula (1), containing no aromatic ring in its backbone, exhibits virtually no absorption in the UV region (wavelength: $\geq 200$ nm) and the visible light region; i.e., has high transparency. Therefore, a pattern produced from the radiation-sensitive negative-type resist composition for pattern formation of the present invention can be employed as optical parts, biochips, etc. Since the epoxy resin represented by formula (1) is produced through epoxidation via oxidation, the epoxy resin is contaminated with smaller amounts of Cl and Na as compared with an epichlorohydrin-type epoxy resin disclosed in Japanese Patent Publication (kokoku) No. 7-78628. Thus, a pattern produced from the radiation-sensitive negative-type resist composition for pattern formation of the present invention can be employed as electronic parts or other parts.

No particular limitation is imposed on the softening point of the epoxy resin represented by formula (1). However, the softening point is preferably 30° C. or higher, more preferably 40 to 140° C., since excessively low temperatures tend to generate folds in the dried resist film.

No particular limitation is imposed on the radiation-sensitive cationic polymerization initiator contained in the radiation-sensitive negative-type resist composition for pattern formation, and a known initiator can be used, so long as the initiator generates an acid upon irradiation with an active energy beam. Examples of the initiator include sulfonium salts, iodonium salts, phosphonium salts, and pyridinium salts.

Examples of the sulfonium salts include triphenylsulfonium hexafluorophosphate, triphenylsulfonium hexafluoroantimonate, bis(4-(diphenylsulfonio)-phenyl)sulfide bis(hexafluorophosphate), bis(4-(diphenylsulfonio)-phenyl) sulfide bis(hexafluoroantimonate), 4-di(p-toluyl)sulfonio-4'-tert-butylphenylcarbonyl-diphenylsulfide hexafluoroantimonate, 7-di(p-toluyl)sulfonio-2-isopropylthioxanthone hexafluorophosphate, 7-di(p-toluyl)sulfonio-2-isopropylthioxanthone hexafluoroantimonate, and aromatic sulfonium salts disclosed in Japanese Patent Application Laid-Open (kokai) Nos. 6-184170, Nos. 7-61964 and 8-165290, U.S. Pat. Nos. 4,231,951 and 4,256,828, etc.

Examples of the iodonium salts include diphenyliodonium hexafluorophosphate, diphenyliodonium hexafluoroantimonate, bis(dodecylphenyl)iodonium tetrakis(pentafluorophenylborate) and aromatic iodonium salts disclosed in Japanese Patent Application Laid-Open (kokai) No. 6-184170, U.S. Pat. No. 4,256,828, etc.

Examples of the phosphonium salts include tetrafluorophosphonium hexafluorophosphate, tetrafluorophosphonium hexafluoroantimonate, and aromatic phosphonium salts disclosed in Japanese Patent Application Laid-Open (kokai) No. 6-157624, etc.

Examples of the pyridinium salts include pyridinium salts disclosed in Japanese Patent No. 2519480, Japanese Patent Application Laid-Open (kokai) No. 5-222112, etc.

The negative-type resist composition of the present invention can be processed in the form of thick film having a thickness in excess of 50 μm. When such a thick film is processed, the drying time required in the step of drying the applied resist liquid and the development time in the developing step increase, which differs from the case of a conventional thin resist film processing. Thus, the negative-type resist composition of the present invention is required to possess high thermal stability and a high contrast between the exposed area and the unexposed area.

Herein, the radiation-sensitive cationic polymerization initiator preferably includes one or more sulfonium salts, because thermal stability of the negative-type resist composition increases when the composition contains, among the aforementioned radiation-sensitive cationic polymerization initiators, a sulfonium salt.

At least one of the anion moieties of the radiation-sensitive cationic polymerization initiator is preferably $SbF_6^-$ or a borate represented by formula (6):

(6)

(wherein each of $x_1$ to $x_4$ represents an integer of 0 to 5, and the sum $x_1+x_2+x_3+x_4$ is 1 or more). When these anion moieties are included, the negative-type resist composition beneficially exhibits a high contrast. Examples of more preferred borates include tetrakis(pentafluorophenyl)borate.

The sulfonium salts and iodonium salts may be products that are readily available on the market. Examples of such radiation-sensitive cationic polymerization initiators include sulfonium salts such as UVI-6990 and UVI-6974 (products of Union Carbide) and Adeka Optomer SP-170 and Adeka Optomer SP-172 (products of Asahi Denka Kogyo K.K.) and iodonium salts such as PI 2074 (product of Rhodia).

No particular limitation is imposed on the amount of the radiation-sensitive cationic polymerization initiator added to the resist composition. However, the amount is preferably 0.1 to 15 parts by weight, more preferably 1 to 12 parts by weight, based on 100 parts by weight of the epoxy resin.

No particular limitation is imposed on the solvent for dissolving therein the epoxy resin contained in the radiation-sensitive negative-type resist composition for pattern formation, and any solvent can be used so long as it can dissolve the epoxy resin. Examples of the solvent include propylene glycol monoalkyl ether acetates such as propylene glycol monomethyl ether acetate and propylene glycol monoethyl ether acetate; alkyl lactate esters such as methyl lactate and ethyl lactate; propylene glycol monoalkyl ethers such as propylene glycol monomethyl ether and propylene glycol monoethyl ether; ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; 2-heptanone; γ-butyrolactone; alkyl alkoxypropionates such as methyl methoxypropionate and ethyl ethoxypropionate; alkyl pyruvate esters such as methyl pyruvate and ethyl pyruvate; ketones such as methyl ethyl ketone, cyclopentanone, and cyclohexanone; N-methylpyrrolidone; N,N-dimethylacetamide; dimethyl sulfoxide; propylene carbonate; and diacetone alcohol. These solvents may be used singly or in combination of two or more species. Among these solvents, γ-butyrolactone is particularly preferred.

The radiation-sensitive negative-type resist composition for pattern formation containing the aforementioned components preferably has a solid content of 10 to 90 wt. % based on the solvent for dissolving the epoxy resin, more preferably 40 to 85 wt. %, more preferably 60 to 80 wt. %. When the solid content is excessively low, application of the composition to form a thick film is difficult, whereas when the solid content is excessively high, application of the composition is difficult, in view of greatly increased viscosity.

Notably, the aforementioned radiation-sensitive negative-type resist composition for pattern formation may contain, in accordance with needs, a variety of additives such as a surfactant, an acid-diffusion-suppressor, a pigment, a dye, a sensitizer, and a plasticizer.

The method for forming a pattern according to the present invention includes a first step of applying to a substrate the aforementioned radiation-sensitive negative-type resist composition for pattern formation; a second step of drying the substrate coated with the radiation-sensitive negative-type resist composition for pattern formation, to thereby form a resist film; a third step of selectively exposing the formed resist film to an active energy beam according to a desired pattern; a fourth step of heating the exposed resist film so as to enhance a contrast of a pattern to be formed; and a fifth step of developing the heated resist film, to thereby remove the unexposed area of the resist film through dissolution, thereby forming a patterned layer. According to this method, a resist pattern having a particularly great thickness and a high aspect ratio can be produced.

In the first step, the aforementioned radiation-sensitive negative-type resist composition for pattern formation of the present invention is applied to a substrate. No particular limitation is imposed on the method for applying the resist composition, and coating methods such as screen printing, curtain coating, blade coating, spin coating, spray coating, dip coating, and slit coating can be employed. Notably, since the radiation-sensitive negative-type resist composition for pattern formation of the present invention can provide a high-concentration resist liquid, thick film coating can be performed through a simple method such as spin coating.

No particular limitation is imposed on the material and surface of the substrate to which the radiation-sensitive negative-type resist composition for pattern formation is applied. For example, the substrate may be formed of silicon, glass, metal, ceramics, organic polymer, etc. These substrates may be subjected to pre-treatment in order to enhance adhesion with the resist composition or other properties. Specifically, silane treatment is performed so as to enhance adhesion with the resist composition.

The substrate to which the radiation-sensitive negative-type resist composition for pattern formation has been applied in the first step is dried in the second step, to thereby form a resist film. No particular limitation is imposed on the method for drying, and the drying step is preferably performed under conditions (temperature and time) such that the solvent contained in the radiation-sensitive negative-type resist composition for pattern formation is vaporized and fold-free resist film is formed, and such that the epoxy resin, radiation-sensitive cationic polymerization initiator, and optionally added additive do not cause thermal reaction which adversely affects pattern formation. Thus, preferred drying conditions include, for example, 40 to 120° C., and 5 minutes to 24 hours. No particular limitation is imposed on the thickness of the resist film. Even when the resist film has a thickness, for example, as great as 50 μm or more, the film can be processed with precision in the subsequent steps. A thickness of 50 μm to 2 mm is particularly preferred.

In the third step, the resist film which has been formed in the second step is selectively exposed to an active energy beam according to a desired pattern. No particular limitation is imposed on the active energy beam for exposure, and examples include UV rays, excimer laser beams, electron beams, and X-rays. Particularly when high pattern precision is required, use of an X-ray having a wavelength of 0.1 to 5 nm is preferred. When high productivity is required, a high-pressure mercury lamp is preferably used as a light source, since the exposure time can be shortened by virtue of a high light energy density.

Notably, in the present invention, because of using the aforementioned radiation-sensitive negative-type resist composition, even when the resist film has a thickness, for example, as great as 50 μm or more, only a short exposure time is required and the type of the active energy beam can be selected from wide ranges in accordance with the desired pattern precision. Specifically, high productivity is attained, since highly useful UV-rays (light source: high-pressure mercury lamp) can be used.

In the fourth step, the resist film which has been exposed to the active energy beam is heated to enhance contrast. If this fourth step is omitted, reaction to form epoxy resin is not fully complete, thereby failing to form a high precision pattern. In the fourth step, the heat treatment must be performed within a time and temperature where thermal reaction of the unexposed resist area to be insoluble in a developer is prevented. The temperature is preferably 70 to 110° C., more preferably 80 to 100° C., and the time is preferably 5 minutes to 10 hours. When the temperature is lower than the above range or the time is shorter than the above range, the contrast is poor, whereas when the temperature is excessively high or the time is excessively long, a problem such as formation of the unexposed area insoluble in a developer arises.

In the fifth step, the resist film which has been heat-treated in the fourth step is developed to remove the unexposed area of the resist through dissolution, thereby forming a patterned layer. Notably, the resist film formed in the present invention has a large thickness and high strength and resolution, whereby a high-aspect pattern layer can be formed. For example, a pattern of an aspect ratio of 10 or higher can be formed.

No particular limitation is imposed on the species of developer, and any solvent can be used so long as the solvent is capable of removing the unexposed portion of the negative-type resist through dissolution. Examples of the solvent serving as a developer include propylene glycol monoalkyl ether acetates such as propylene glycol monomethyl ether acetate and propylene glycol monoethyl ether acetate; alkyl lactate esters such as methyl lactate and ethyl lactate; propylene glycol monoalkyl ethers such as propylene glycol monomethyl ether and propylene glycol monoethyl ether; ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; 2-heptanone; γ-butyrolactone; alkyl alkoxypropionates such as methyl methoxypropionate and ethyl ethoxypropionate; alkyl pyruvate esters such as methyl pyruvate and ethyl pyruvate; ketones such as methyl ethyl ketone, cyclopentanone, and cyclohexanone; N-methylpyrrolidone; N,N-dimethylacetamide; dimethyl sulfoxide; propylene carbonate; and diacetone alcohol. Of these, γ-butyrolactone, propylene glycol monomethyl ether acetate, etc. are particularly preferred.

The development can be performed any of a variety of methods, such as the spray method, the paddle method, and immersion. Among these immersion is preferred, because breakage of patterns such as peeling is prevented. In addition, ultrasonication may be performed in accordance with needs.

In the fifth step, in accordance with needs a rinse step is preferably performed after completion of the development. No particular limitation is imposed on the mode of the rinse step, the rinse liquid, and the rinsing method, and known rinse liquids and methods can be employed.

In addition, after completion of the development and the rinse step, the resist pattern may be stabilized through heating under known conditions.

According to the aforementioned method for forming a pattern of the present invention, the resist composition for pattern formation can be applied to a substrate in a simple manner so as to accurately control film thickness (e.g., spin coating); the exposure light source can be selected in accordance with the target pattern precision; the entire area of the resist composition can be exposed through a photomask or similar means; and high productivity is attained by virtue of a short exposure time. Thus, a resist pattern having high pattern precision, a great thickness, and a high aspect ratio can be formed.

The thus-formed resist pattern can serve as a thick-film permanent pattern, thereby providing a variety of parts such as electronic parts, optical parts, and biochips. Needless to say, in addition to thick-film patterns, a thin-film pattern can also be formed from the resist composition of the present invention. Thus, the resist patterns formed according to the present invention find wide utility.

In other words, the resist pattern formed through the pattern formation method of the present invention can be employed as any of a variety of parts and can find an intrinsic use; e.g., a resist pattern for forming other patterns. Specifically, when the radiation-sensitive negative-type resist composition for pattern formation is applied to a copper-clad laminated board for producing a printed wiring board, a wiring pattern can be formed. In this case, a resist pattern is formed on the substrate, followed by etching copper foil by an agent such as acid. Since the resist pattern formed according to the present invention is considerably stable against an agent; i.e., has excellent resistance as an etching mask, an excellent wiring pattern can be formed.

The resist pattern can also be employed as a solder mask. In this case, a printed wiring board having a circuit pattern and formed by etching copper foil of a copper-clad laminated board is employed as a substrate. After formation of a resist pattern on the wiring board, electronic parts are firmly connected and mounted to the wiring board through a flow soldering method or a reflow soldering method, to thereby provide a electronic circuit unit. Since the resist pattern formed according to the present invention is thermally stable; i.e., has excellent resistance as a solder mask, an excellent electronic circuit unit can be formed.

Figure 1A:
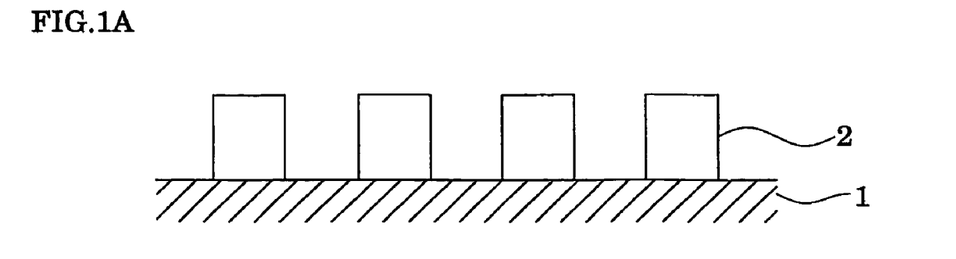
FIGS. 1A to 1D show a method for forming a pattern according to one embodiment of the present invention.
Figure 1B:
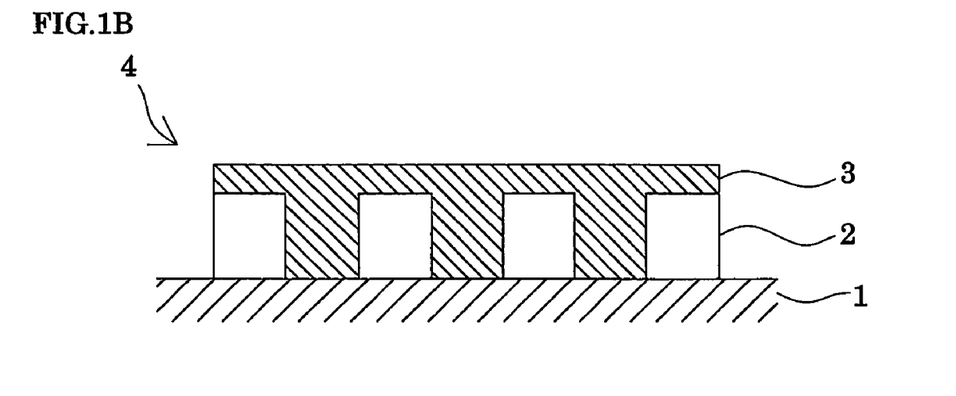
Figure 1C:
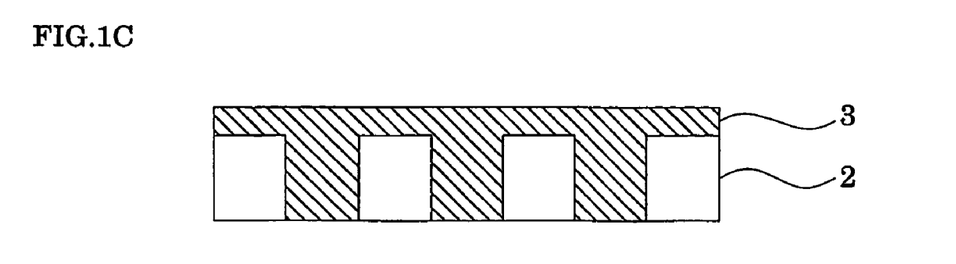
Figure 1D:
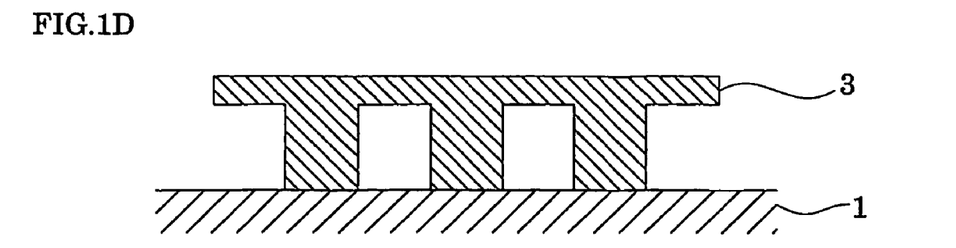
Figure 2A:
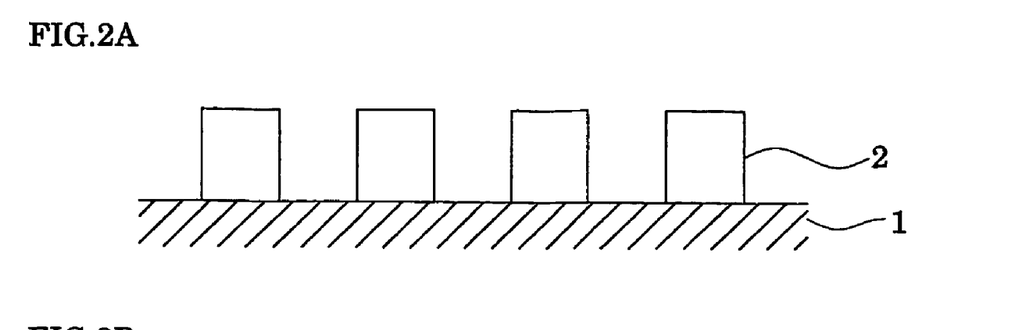
FIGS. 2A to 2D show a method for forming a pattern according to another embodiment of the present invention.
Figure 2B:
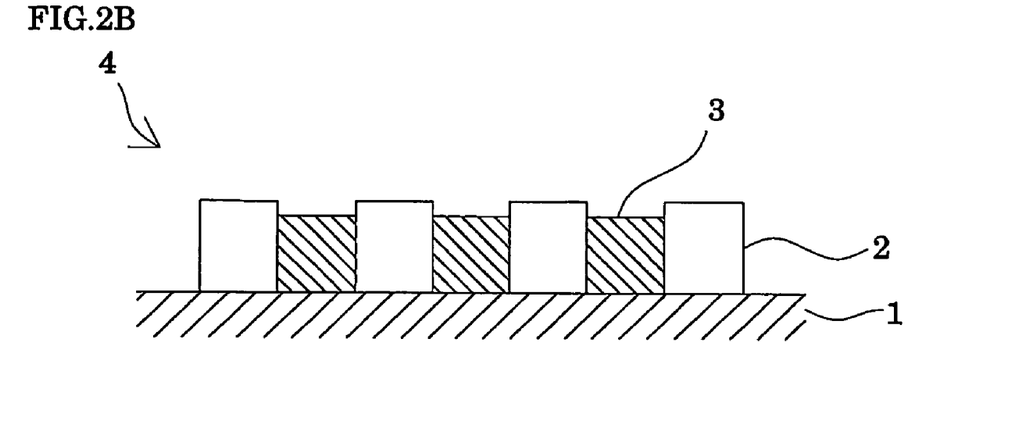
Figure 2C:
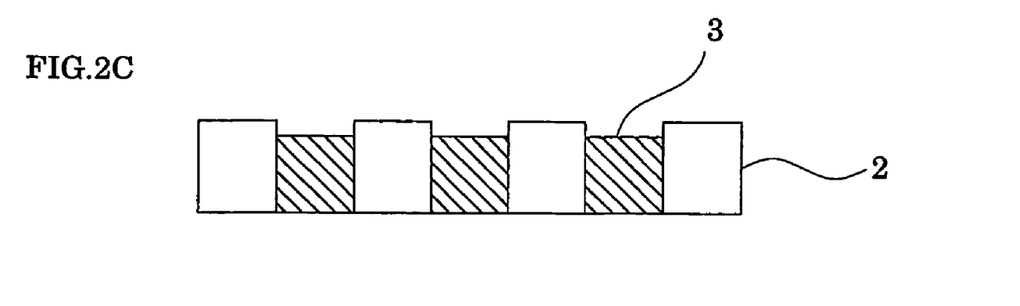
Figure 2D:
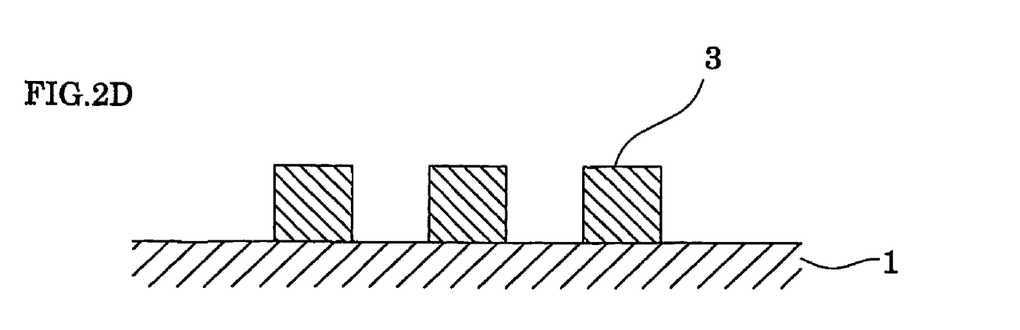

After the fifth step, a material other than that of the patterned layer which has been formed in the fifth step may be applied to the patterned layer such that spaces present in the patterned layer are filled, at least to some height, with the material, to thereby form a second layer, as a sixth step. Specifically, as shown in FIGS. 1 and 2, a second layer 3 formed of a material other than that of a patterned layer 2 (FIGS. 1A and 2A) formed on a substrate 1 is provided such that spaces present in the patterned layer 2 are filled, at least to some height, with the material, to thereby produce a composite structure of the patterned layer 2 and the second layer 3 (FIGS. 1B and 2B). Notably, the second layer 3 may be provided exclusively in the space present in the patterned layer 2 or may be provided such that the second layer completely covers the surface of the patterned layer 2. The composite structure 4 formed of the patterned layer 2 and the second layer 3 itself can serve as a part. However, alternatively, the composite structure may be removed from the substrate 1 (FIGS. 1C and 2C) or only the patterned layer 2 may be removed (FIGS. 1D and 2D). No particular limitation is imposed on the method for removing only the patterned layer 2, and any of known wet methods and dry methods can be employed. In one wet method, immersion in an organic solvent such as N-methylpyrrolidone or in an organic alkaline solution agent such as ethanolamine solution is employed. In one dry method, dry etching (e.g., reactive ion etching) or ashing is employed.

No particular limitation is imposed on the material for forming the second layer 3. When a metal is used as the material, a composite structure of a resist patterned layer and a metal layer can be produced through a step; e.g., a plating step.

Although no particular limitation is imposed on the method for performing the plating step, electroplating is preferred. Plating of copper, nickel, silver, gold, solder, copper/nickel multilayer, a complex system thereof, etc. can be performed through any known conventional method. Such methods are disclosed in, for example, Comprehensive Bibliography of Surface Treatment Techniques (published by Technical Material Center, 1987/12/21, 1st edition, p. 281-422). Notably, when electroplating is performed, the substrate surface to which the radiation-sensitive negative-type resist composition for pattern formation is applied is preferably electrocondutive, from the viewpoint of facilitating electroplating.

The material for forming the second layer 3 may be a resin. In this case, a composite structure of a resist patterned layer and a resin layer can be produced by, for example, casting a photocurable or thermosetting(heatcurable) resin to form the second layer 3, and photo-curing or thermally curing the cast resin. No particular limitation is imposed on the species of the photocurable or thermosetting resin, However a photocurable or thermosetting PDMS (polydimethylsiloxane) is particularly preferred, because PDMS can be readily cured through light or heat.

EXAMPLES

The present invention will next be described in detail by way of examples, which should not be construed as limiting the invention thereto.

1. Preparation of Radiation-Sensitive Negative-Type Resist Compositions for Pattern Formation Examples 1 to 4

The resist materials were mixed in the proportions shown in Table 1, and the resultant mixture was uniformly kneaded by means of a three-roll mill, to thereby prepare the respective radiation-sensitive negative-type resist compositions for pattern formation. The structures and product names of the epoxy resins and cationic polymerization initiators are shown below.

TABLE 1

| | Epoxy resin | Cationic polymerization initiator | Solvent (λ-butyrolactone) |
|---|---|---|---|
| Example 1 | Resin-1 70.0 g | PI-1 8.0 g | 22.0 g |
| Example 2 | Resin-1 70.0 g | PI-2 8.0 g | 22.0 g |
| Example 3 | Resin-1 70.0 g | PI-3 + diethylthioxanthone 4.0 g + 0.5 g | 26.0 g |
| Example 4 | Resin-1 70.0 g | PI-4 4.0 g | 26.0 g |
| Comparative Example 1 | Resin-2 70.0 g | PI-1 8.0 g | 25.0 g |

(n1 + n2 + n3 ≈ 15)
Resin-1

Resin-2

Resin-1: EHPE-3150 (epoxy resin, product of Daicel Chemical Industries, Ltd.)
Resin-2: EPON SU-8 (epoxy resin, product of Shell Chemical)

TABLE 1-continued

PI-1: UVI-6974 (cationic polymerization initiator, product of Union Carbide, a mixture predominantly containing the above PI-1, effective ingredient content: 50 wt. %)
PI-2: UVI-6990 (cationic polymerization initiator, product of Union Carbide, a mixture predominantly containing the above PI-2, effective ingredient content: 50 wt. %)
PI-3: SarCat CD-1012 (cationic polymerization initiator, product of Sartomer Co.)
PI-4: A mixture predominantly containing PI-4.

Comparative Example 1

In a manner similar to that of Examples 1 to 4, a radiation-sensitive negative-type resist composition of Comparative Example 1 for pattern formation having a composition shown in Table 1 was prepared.

2. Evaluation of Patterning Characteristics (1) Production of Resist Film

Examples 1a to 4a

Each of the radiation-sensitive negative-type resist compositions for pattern formation of Examples 1 to 4 was applied by means of a spin-coater to a silicon substrate which had been surface-coated with copper through sputtering. Subsequently, the substrate was heated on a hot plate at 90° C. for 30 minutes so as to dry the resist composition, to thereby form a resist film having a thickness of 100 μm.

Comparative Example 1a

The procedure of Examples 1a to 4a was repeated, except that the radiation-sensitive negative-type resist composition of Comparative Example 1 was used instead of the radiation-sensitive negative-type resist compositions of Examples 1 to 4, to thereby form a resist film having a thickness of 100 μm.

Comparative Example 2a

PMMA Syrup [product of Rohm, a mixture of PMMA (polymethyl methacrylate), a thermal polymerization initiator, and an MMA (methyl methacrylate) solution serving as a cross-linking agent] was cast into a space formed by glass slides on a silicon substrate. The cast mixture was covered with a glass plate disposed on the glass slides and polymerized at 110° C. for one hour for curing. The cured product was cooled at 15° C./hour, to thereby form a PMMA resist film having a thickness of 100 μm.

Test Example 1

The thickness of each of the resist films produced in Examples 1a to 4a and Comparative Examples 1a and 2a was determined at three arbitrary points on the substrate, whereby uniformity of the film (coatability) was evaluated. Specifically, the case in which the difference between the maximum thickness and the minimum thickness was less than 5 μm was assigned a rating "AA". Similarly, the case in which the difference was 5 to 10 μm was assigned a rating "BB", and the case in which the difference was in excess of 10 μm was assigned a rating "CC". Table 2 shows the results.

(2) Resist Pattern Formation

Examples 1b to 4b

Each of the resist films produced in Examples 1a to 4a was irradiated with light. When a high-pressure mercury lamp or an KrF excimer laser was used as the light source, a quartz UV mask was used, whereas when an X-ray (wavelength: 0.2 to 1 nm) based on synchrotron radiation was used, a diamond membrane on which a gold light-absorbing pattern was formed was used as an X-ray mask. Subsequently, the substrate was heated on a hot-plate at 90° C. for 10 minutes, followed by immersion of the irradiated resist film in propylene glycol monomethyl ether acetate for 30 minutes for developing, to thereby form a resist pattern. The irradiation dose at each test is shown in Table 2.

Comparative Example 1b

The procedure of Examples 1b to 4b was repeated, except that the resist film produced in Comparative Example 1a was used instead of the resist films produced in Examples 1a to 4a, to thereby form a resist pattern.

Comparative Example 2b

The PMMA resist film of Comparative Example 2a was irradiated through a mask similar to that employed in Examples 1b to 4b. The thus-irradiated resist film was immersed in a mixture containing ethanol, oxazine, aminoethanol, and water for 12 hours with ultrasonication for developing, to thereby form a resist pattern.

Test Example 2

Each of the resist patterns produced in Examples 1b to 4b and Comparative Examples 1b and 2b was observed under an optical microscope, to thereby evaluate the resist composition in terms of its sensitivity. Specifically, the case in which no curved or deformed portion of the pattern formed by swelling was observed was assigned a rating "AA". Similarly, the case in which the top of the pattern had creases but no curved portion was observed was assigned a rating "BB", and the case in which a curved portion was observed was assigned a rating "CC".

The pattern was also evaluated in terms of the resolution of each resist composition. Specifically, the case in which the resist pattern was resolved at a mask width of 10 μm (aspect ratio: 10) was assigned a rating "AA". Similarly, the case in which the resist pattern was resolved at a mask width of 20 μm (aspect ratio: 5) was assigned a rating "BB", and the case in which the resist pattern was not resolved was assigned a rating "CC". Table 2 shows the results.

TABLE 2

| | Light source | Dose J/cm² | Coatability | Sensitivity | Resolution |
|---|---|---|---|---|---|
| Examples 1a and 1b | High-pressure mercury lamp | 1 | AA | AA | AA |
| | KrF | 10 | AA | AA | AA |
| | Synchrotron radiation | 100 | AA | AA | AA |
| Examples 2a and 2b | High-pressure mercury lamp | 1 | AA | CC | CC |
| | KrF | 10 | AA | AA | BB |
| | Synchrotron radiation | 100 | AA | BB | BB |
| | | 1000 | AA | BB | BB |
| Examples 3a and 3b | High-pressure mercury lamp | 1 | AA | AA | BB |
| | KrF | 10 | AA | AA | BB |
| | Synchrotron radiation | 100 | AA | AA | BB |
| Examples 4a and 4b | High-pressure mercury lamp | 1 | AA | AA | AA |
| | KrF | 10 | AA | AA | AA |
| | Synchrotron radiation | 100 | AA | AA | AA |
| Comparative Examples 1a and 1b | High-pressure mercury lamp | 1 | AA | AA | AA |
| | KrF | 10 | AA | Pattern not formed | |
| | Synchrotron radiation | 100 | AA | AA | AA |

TABLE 2-continued

|  | Light source | Dose J/cm² | Coatability | Sensitivity | Resolution |
|---|---|---|---|---|---|
| Comparative Examples 2a and 2b | High-pressure mercury lamp | 1 | CC | Pattern not formed | |
| | | 100 | CC | Pattern not formed | |
| | KrF | 10 | CC | Pattern not formed | |
| | Synchrotron radiation | 100 | CC | Pattern not formed | |
| | | 10000 | CC | AA | AA |

The test results of Examples 1a and 4a indicate excellent coatability, and the test results of Examples 1b and 4b indicate excellent properties under all exposure conditions (light sources: high-pressure mercury lamp, KrF excimer laser beam, and X-ray based on synchrotron radiation).

The test results of Example 2a indicate excellent coatability. The test results of Example 2b indicate generally excellent properties, although curing sensitivity is slightly inferior to that obtained in Example 1b.

The test results of Example 3a indicate excellent coatability. The test results of Example 3b indicate generally excellent properties, although the development rate of unexposed portions was slow and the formed pattern was slightly affected.

The test results of Comparative Example 1a indicate excellent coatability. The test results of Comparative Example 1b indicate excellent properties under exposure conditions (light sources: high-pressure mercury lamp and X-ray based on synchrotron radiation). However, in Comparative Example 1b, a resist pattern was not formed through exposure to a KrF excimer laser beam.

In Comparative Example 2a, a resist film having a uniform thickness failed to be formed. The test results of Comparative Example 2b indicate that forming a resist pattern requires severe exposure conditions which are not practically employed (i.e., synchrotron radiation of 10,000 J/cm²).

3. Softening Point and Appearance of Resist Film Formed through Drying

Test Example 3

The softening point of the resist film of Example 1a was determined through the method specified by JIS K 7234, and the resist film was visually observed. As a result, the resist film was found to have a softening point of 60° C. and was found to be an excellent resist film free from creases and folds.

4. The Measurement of the Level of Cl in Resins

Test Example 4

Each of Resin-1 and Resin-2 was dissolved in dioxane, and a potassium hydroxide aqueous solution was added to the resin solution. Subsequently, the mixture was refluxed for 30 minutes. The level of Cl that induces hydrolysis in each resin was determined through silver nitrate titration. Table 3 shows the results.

TABLE 3

| | Cl level |
|---|---|
| Resin-1 | not detected |
| Resin-2 | 1,700 ppm |

As is clear from Table 3, Resin-1, employed in Examples 1 to 4, contains almost no migrated Cl, whereas Resin-2, employed in Comparative Example 1, contains a considerably high level of migrated Cl.

5. Formation of a Composite Structure of a Resist Patterned Layer and a Metal Layer Example 1c The substrate on which the resist pattern of Example 1b had been formed was immersed in Microfab Au 100 (plating solution, product of Tanaka Kikinzoku Kogyo, K.K.), and plating was performed at room temperature and a current density of 1 to 10 A/100 cm², to form an Au plating layer (second layer), to thereby produce a composite structure of a resist patterned layer and a metal layer.

Test Example 5

The composite structure of a resist patterned layer and a metal layer produced in Example 1c was observed under a microscope, to thereby evaluate formation status. Specifically, the case in which the resist pattern was uniformly plated and a pattern was formed with high precision through transfer of the original resist pattern was assigned a rating "O." Similarly, the case in which the resist pattern was not uniformly plated and/or failure in formation of a pattern formed through transfer of the original resist pattern was observed was assigned a rating "X." The results are shown in Table 4.

6. Formation of a Composite Structure of a Resist Patterned Layer and a Resin Layer Example 1d Onto the substrate on which the resist pattern of Example 1b had been formed, a mixture of unpolymerized PDMS (Sylgard 184, product of Dow Corning) and an initiator (monomer:initiator=10:1) was poured. The liquid was heated at 100° C. for two hours for polymerization. The substrate was cooled to room temperature, to thereby produce a composite structure of a resist patterned layer and a resin layer.

Test Example 6

The composite structure of a resist patterned layer and a resin layer produced in Example 1d was observed under a microscope, to thereby evaluate formation status. Specifically, the case in which broken fragments of the resist pattern did not exist and a pattern was formed with high precision through transfer of the original resist pattern was assigned a rating "O." Similarly, the case in which the original resist pattern was broken and/or failure in formation of a pattern formed through transfer of the original resist pattern was observed was assigned a rating "X." The results are shown in Table 4.

TABLE 4

| | Light source | Dose J/cm² | Test Example 5 (metal pattern) | Test Example 6 (resin pattern) |
|---|---|---|---|---|
| Examples 1c and 1d | High-pressure mercury lamp | 1 | O | O |
| | KrF | 10 | O | O |
| | Synchrotron radiation | 100 | O | O |

As is clear from Table 4, excellent composite structures of a resist patterned layer and a metal or resin layer and resin can be produced in Examples 1c and 1d. In other Examples, excellent resist patterns were produced. Thus, similar to the cases of Examples 1c and 1d, excellent composite structures of a resist patterned layer and a metal or resin layer could be formed.

INDUSTRIAL APPLICABILITY

As described hereinabove, the present invention provides a radiation-sensitive negative-type resist composition for pattern formation, wherein the resist composition can be applied to a substrate in a simple manner so as to accurately control film thickness (e.g., spin coating); the exposure light source can be selected in accordance with the target pattern precision; the entire area of the resist composition can be exposed through a photomask or similar means; and high productivity is attained by virtue of a short exposure time, thereby forming a resist pattern having has high pattern precision, a great thickness, and a high aspect ratio. The invention also provides a method for forming a pattern by use of the resist composition.

The invention claimed is:

1. A method for forming a pattern, characterized in that the method comprises: a first step of applying to a substrate a radiation-sensitive negative-type resist composition for pattern formation, and the radiation-sensitive negative-type resist composition for pattern formation contains an epoxy resin, a radiation-sensitive cationic polymerization initiator, and a solvent for dissolving the epoxy resin therein, characterized in that the resist composition, through drying, forms a resist film having a softening point falling within a range of 30 to 120° C. and that the epoxy resin is represented by formula (1):

wherein $R_1$ represents a moiety derived from an organic compound having k active hydrogen atoms (k represents an integer of 1 to 100); each of $n_1$, $n_2$, through $n_k$ represents 0 or an integer of 1 to 100; the sum of $n_1$, $n_2$, through $n_k$ falls within a range of 1 to 100; and each of "A"s, may be identical to or different from each other, represents an oxycyclohexane skeleton represented by formula (2):

wherein X represents any of groups represented by formulas (3) to (5):

(wherein $R^2$ represents a hydrogen atom, an alkyl group, or an acyl group), and at least two groups represented by formula (3) are contained in one molecule of the epoxy resin)); a second step of drying the substrate coated with the radiation-sensitive negative-type resist composition for pattern formation, to thereby form a resist film which has a thickness of at least 50 μm; a third step of selectively exposing the formed resist film to an active energy beam according to a desired pattern; a fourth step of heating the exposed resist film so as to enhance a contrast of a pattern to be formed; and a fifth step of developing the heated resist film, to thereby remove the unexposed area of the resist film through dissolution, thereby forming a patterned layer.

2. A method for forming a pattern according to claim 1, wherein the method includes, after completion of the fifth step, a sixth step of applying to the patterned layer a material other than that of the patterned layer such that spaces present in the patterned layer are filled, at least to some height, with the material, to thereby form a second layer.

3. A method for forming a pattern according to claim 2, wherein the second layer is formed through metal plating.

4. A method for forming a pattern according to claim 2, wherein the second layer is formed by casting a photo-curable or heat-curable resin and curing the resin by light or heat.

* * * * *